(12) United States Patent
Inaishi

(10) Patent No.: US 6,171,759 B1
(45) Date of Patent: *Jan. 9, 2001

(54) PHOTOCURABLE COMPOSITION

(75) Inventor: Kouji Inaishi, Okazaki (JP)

(73) Assignee: Brother Kogyo Kabushiki Kaisha, Nagoya (JP)

( * ) Notice: Under 35 U.S.C. 154(b), the term of this patent shall be extended for 0 days.

This patent is subject to a terminal disclaimer.

(21) Appl. No.: 08/396,054

(22) Filed: Feb. 28, 1995

Related U.S. Application Data

(63) Continuation of application No. 08/019,851, filed on Feb. 19, 1993, now abandoned.

(30) Foreign Application Priority Data

May 14, 1992 (JP) .................................................... 4-121824

(51) Int. Cl.$^7$ ............................ G03C 1/735; G03F 7/028
(52) U.S. Cl. ..................................... 430/288.1; 430/281.1; 430/914; 430/915; 430/926; 522/25; 522/26; 522/28
(58) Field of Search .................................. 430/281, 288, 430/926, 915, 914, 916, 944, 281.1, 288.1; 522/25, 26, 27, 28

(56) References Cited

U.S. PATENT DOCUMENTS

| | | |
|---|---|---|
| Re. 28,789 | 4/1976 | Chang . |
| 2,588,899 | 3/1952 | Voorthuis et al. . |
| 3,418,118 | 12/1968 | Thommes et al. . |
| 3,479,185 | 11/1969 | Chambers . |
| 3,495,987 | 2/1970 | Moore . |
| 3,652,275 | 3/1972 | Baum et al. . |
| 3,756,827 | 9/1973 | Chang . |
| 4,366,228 * | 12/1982 | Specht et al. ........................ 430/281.1 |
| 4,548,891 | 10/1985 | Rediker et al. .................... 430/283.1 |
| 4,766,055 | 8/1988 | Kawabata et al. ................ 430/281.1 |
| 4,772,530 | 9/1988 | Gottschalk ............................ 430/138 |
| 4,777,190 | 10/1988 | Sasaki et al. ............................ 522/17 |
| 4,857,437 | 8/1989 | Banks et al. ............................ 430/327 |
| 4,857,654 | 8/1989 | Rediker et al. ........................ 556/53 |
| 4,859,572 | 8/1989 | Farid et al. ......................... 430/281.1 |
| 4,874,685 * | 10/1989 | Adair .................................. 430/281.1 |
| 4,910,121 | 3/1990 | Rediker et al. .................... 430/281.1 |
| 4,985,470 | 1/1991 | Nagasaka et al. ................. 430/281.1 |
| 4,987,056 * | 1/1991 | Imahashi et al. .................. 430/281.1 |
| 4,988,607 * | 1/1991 | Ali ....................................... 430/271.1 |
| 5,049,479 | 9/1991 | Zertani et al. ..................... 430/271.1 |
| 5,100,756 * | 3/1992 | Kobayashi et al. ................ 430/281.1 |
| 5,102,775 | 4/1992 | Okuhara et al. ................... 430/287.1 |
| 5,147,758 * | 9/1992 | Smothers et al. .................. 430/281.1 |
| 5,219,709 * | 6/1993 | Nagasaka et al. ................. 430/281.1 |
| 5,275,917 * | 1/1994 | Inaishi ............................... 430/281.1 |

FOREIGN PATENT DOCUMENTS

| | | |
|---|---|---|
| 0 152 377 | 8/1989 | (EP) . |
| 61-218551 | 9/1886 | (JP) . |
| 44-20189 | 8/1969 | (JP) . |
| 45-37377 | 11/1970 | (JP) . |
| 47-2528 | 2/1972 | (JP) . |
| 48-22443 | 3/1973 | (JP) . |
| 48-84183 | 11/1973 | (JP) . |
| 52-134692 | 4/1976 | (JP) . |
| 52-112681 | 9/1977 | (JP) . |
| 54-151024 | 11/1979 | (JP) . |
| 54-155292 | 12/1979 | (JP) . |
| 57-21401 | 2/1982 | (JP) . |
| 58-19315 | 2/1983 | (JP) . |
| 58-29803 | 2/1983 | (JP) . |
| 58-40302 | 3/1983 | (JP) . |
| 59-56403 | 3/1984 | (JP) . |
| 60-32801 | 2/1985 | (JP) . |
| 60-88005 | 5/1985 | (JP) . |
| 60-136542 | 7/1985 | (JP) . |
| 60-174750 | 9/1985 | (JP) . |
| 60-221403 | 11/1985 | (JP) . |
| 60-228448 | 11/1985 | (JP) . |
| 61-143370 | 7/1986 | (JP) . |
| 61-145143 | 7/1986 | (JP) . |
| 61-167680 | 7/1986 | (JP) . |
| 61-167681 | 7/1986 | (JP) . |
| 61-218550 | 9/1986 | (JP) . |
| 61-238755 | 10/1986 | (JP) . |
| 61-243682 | 10/1986 | (JP) . |
| 61-258802 | 11/1986 | (JP) . |
| 61-258803 | 11/1986 | (JP) . |
| 61-260038 | 11/1986 | (JP) . |
| 62-432 | 1/1987 | (JP) . |
| 62-465 | 1/1987 | (JP) . |
| 62-143043 | 6/1987 | (JP) . |
| 62-143044 | 6/1987 | (JP) . |
| 63-23901 | 2/1988 | (JP) . |
| 63-41484 | 2/1988 | (JP) . |
| 1-146842 | 6/1989 | (JP) . |
| 1-146844 | 6/1989 | (JP) . |
| 1-146845 | 6/1989 | (JP) . |
| 1-146846 | 6/1989 | (JP) . |
| 1-146847 | 6/1989 | (JP) . |

(List continued on next page.)

OTHER PUBLICATIONS

Suzuki et al. "Visible–Light–Sensitive . . . " Chemical Abstracts, vol. 116, No. 4, p. 714, Abstract No. 31425k. Jan. 27, 1992 (a).
Photoinitiated Cationic Polymerization of Epoxides with Iron–Arene Complexes—Meier et al. Oct. 1986—Journal of Radiation Curing pp. 27–31.
Grant & Hachk's Chemical Dictionary, Fifth Edition, R. Grant & C. Grant, Eds. (1987) pp. 24 and 548.*

(List continued on next page.)

Primary Examiner—Janis L. Dote
(74) Attorney, Agent, or Firm—Oliff & Berridge, PLC

(57) ABSTRACT

A photocurable composition containing at least a radical polymerizable unsaturated group-bearing compound, a metal allene compound, a squalilium dye, and N,N-dimethylaniline. The photocurable composition is polymerized and cured by generation of radicals upon receipt of low energy of visible light having long wavelengths or near infrared light.

8 Claims, No Drawings

| FOREIGN PATENT DOCUMENTS | | |
|---|---|---|
| 1-146851 | 6/1989 | (JP) . |
| 1-146864 | 6/1989 | (JP) . |
| 1-228960 | 9/1989 | (JP) . |
| 1-228961 | 9/1989 | (JP) . |
| 1-230674 | 9/1989 | (JP) . |
| 2-19858 | 5/1990 | (JP) . |
| 2-296802 | 12/1990 | (JP) . |
| 3-39747 | 2/1991 | (JP) . |

OTHER PUBLICATIONS

"Light–Sensitive Systems: Chemistry & Application of Nonsilver Halide Photographic Processes" J. Kosar Wiley & Sons New York (1965) p. 145.*

Encyclopedia of Polymer Science and Engineering, vol. 11, John Wiley & Sons, NY (1988) p. 209.*

RCA Electro–Optics Handbook, RCA Corp., (1974), p. 14.*

* cited by examiner

PHOTOCURABLE COMPOSITION

This is a Continuation of application Ser. No. 08/019,851 filed Feb. 19, 1993, now abandoned.

BACKGROUND OF THE INVENTION

1. Field of the Invention

The invention relates to a photocurable composition and, more particularly, to a photocurable composition which undergoes a curing reaction as a result of a high sensitivity to visible light or near infrared light so as to be employable for a photoresist or in image recording.

2. Description of Related Art

There have conventionally been disclosed in a number of publications many kinds of photocurable compositions curable by visible light, i.e., having a sensitivity to visible light. In general, such a photocurable composition is composed of a polymerizable compound and a polymerization initiator system. The polymerization initiator system generally contains at least a polymerization initiator and a sensitizer dye for modifying a wavelength. The photocurable compositions disclosed in many publications have the following polymerization initiator systems, e.g., composition initiator systems of dyes and aliphatic amines (Japanese Patent Publication No. Sho 44-20189); initiator systems of hexaarylbiimidazoles, radical generators and dyes (Japanese Patent Publication No. Sho 45-37377); initiator systems of hexaarylbiimidazoles and p-dialkylaminobenzylidene ketones (Japanese Patent Laid-open No. Sho 47-2528); initiator systems of cyclic-cis-dicarbonyl compounds and dyes (Japanese Patent Laid-open No. Sho 48-84183); initiator systems of carbonyl compounds and tertiary amines (Japanese Patent Laid-open No. Sho 52-134692); initiator systems employing (keto)coumarin (Japanese Patent Laid-open No. Sho 52-112681); initiator systems of substituted triazines and merocyanine dyes (Japanese Patent Laid-open No. Sho 54-151024); initiator systems of biimidazoles and indanones (Japanese Patent Laid-open No. Sho 54-155292); initiator systems of hexaarylbiimidazoles and p-dialkylaminostilbene derivatives (Japanese Patent Laid-open No. Sho 57-21401); initiator systems of hexaarylbiimidazoles and p-dialkylaminocinnamylidene derivatives (Japanese Patent Laid-open No. Sho 58-19315); initiator systems of triazine derivatives and cyanine dyes (Japanese Patent Laid-open No. Sho 58-29803); initiator systems of triazine derivatives and thiapyrylium salts (Japanese Patent Laid-open No. Sho 58-40302); initiator systems of hexaarylbiimidazoles and n-dialkylstilbene derivatives or p-dialkylaminophenylbutanienyl derivatives and thiol compounds (Japanese Patent Laid-open No. Sho 59-56403); initiator systems of ketone-substituted derivatives and organic peroxides (Japanese Patent Laid-open No. Sho 60-32801); initiator systems of coumarin dyes and diarylidonium salts (Japanese Patent Laid-open No. Sho 60-88005); initiator systems of -diketones and mercapto carboxylic acids (Japanese Patent Laid-open No. Sho 61-258802); initiator systems of xanthene dyes and photopolimerization accelerators (Japanese Patent Laid-open No. Sho 60-221403); initiator systems of -diketones and polysulfides (Japanese Patent Laid-open No. Sho 61-258803); initiator systems of xanthene dyes, radical generators and peroxides (Japanese Patent Laid-open No. Sho 62-143043); initiator systems employing dye borate complexes (Japanese Patent Laid-open No. Sho 62-143044); initiator systems of coumarin dyes and organic peroxides (Japanese Patent Laid-open No. Sho 63-23901); initiator systems employing titanocene (Japanese Patent Laid-open No. Sho 63-41484); and initiator systems employing metal allene complexes (Japanese Patent Laid-open No. Hei 2-296802). These photocurable compositions involve compositions curable with low energy provided by light having wavelengths near those of ultraviolet light, compositions curable with low energy provided by visible light having wavelengths up to about 550 nm, and compositions curable with high energy provided by visible light having wavelengths longer than 550 nm.

The photocurable compositions having a sensitivity to near ultraviolet light or the visible light having wavelengths up to about 550 nm can be cured with low energy, but the photocurable compositions curable by the visible light having wavelengths longer than 550 nm are required to receive high energy for curing. Accordingly, there is a problem that if an ordinary light source is used, a great amount of time is required to provide enough energy, or a high energy, to cure the photocurable composition. There is another problem in that if an operator intends to make a single operation time of the light source as short as possible, the operator must use an expensive light source capable of providing high energy in a short time. In view of the above problems, there has been desired a photocurable composition quickly curable with low energy by an ordinary light source emitting the visible light having wavelengths longer than 550 nm or near infrared light. To meet this desire, the present applicant has proposed, in Japanese Patent Application No. Hei 3-168404 (corresponding to U.S. patent application Ser. No. 07/900, 140 which is U.S. Pat. No. 5,275,917 issued Jan. 4, 1994) a photocurable composition employing a metal arene compound and a squalilium dye as a photopolymerization initiator system. The energy for curing this photocurable composition is 4070.49 erg/cm$^2$, which is considerably lower than the energies for curing any conventional photocurable compositions. However, there is still a need to provide a photocurable composition curable with much lower energy.

SUMMARY OF THE INVENTION

It is accordingly an object of the invention to provide a photocurable composition which can be cured with much lower energy by visible light or near infrared light.

According to the invention, there is provided a photocurable composition comprising a radical polymerizable unsaturated group-bearing compound, a metal arene compound, a squarylium dye, and N,N-dialkylaniline.

The metal arene compound, the squarylium dye and the N,N-dialkylaniline cause wavelength sensitization so that the photocurable composition is cured with a low energy using visible light having long wavelengths or near infrared light.

DESCRIPTION OF THE PREFERRED EMBODIMENT

The photocurable composition of the invention will now be described in more detail.

Examples of the radical polymerizable unsaturated group-bearing compound to be used in the invention include N-vinyl-2-pyrolidone, bisphenol A diacrylate and dimethacrylate, tripropylene glycol diacrylate and dimethacrylate, pentaerythritol triacrylate and trimethacrylate, dipentaerythritol hexaacrylate and hexamethacrylate, and trimethylolpropane triacrylate and trimethacrylate. These radical polymerizable unsaturated group-bearing compounds may be used singly or in combination.

An example of the metal arene compound to be used as the photopolymerization initiator in the present invention may have the structure expressed by the following general formula:

FORMULA 1

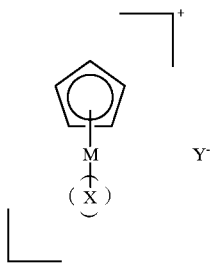

wherein X represents a group containing at least one benzene ring; Y represents a basic ion such as BF4-, PF6-, AsF6- or SbF6-; and M represents a metal such as iron, nickel and cobalt.

Examples of the squarylium dye to be used in the present invention may include those set forth in Japanese Patent Laid-open Nos. Sho 48-22443, 60-136542, 60-174750, 60-228448, 61-143370, 61-145143, 61-167680, 61-167681, 61-218550, 61-218551, 61-238755, 61-243862, 61-260038, 62-432 and 62-465 and Nos. Hei 1-146842, 1-146844, 1-146845, 1-146846, 1-146847, 1-146851, 1-146864, 1-228960, 1-228961 and 1-230674, and Japanese Patent Publication No. Hei 2-19858. Of these, preferred squarylium dyes are those having the structure expressed by the following general formula:

FORMULA 2

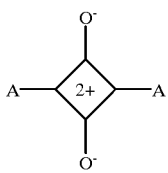

wherein each A represents a substituted or unsubstituted condensed ring group, a methylene group double bonded to a substituted or unsubstituted heterocyclic ring, or a substituted or unsubstituted aminophenol group.

For example, the squarylium dyes having the structures expressed by the following formulas may be used.

FORMULA 3

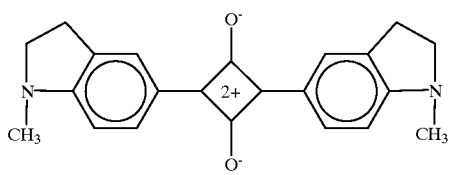

FORMULA 4

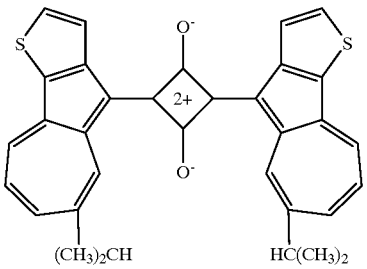

FORMULA 5

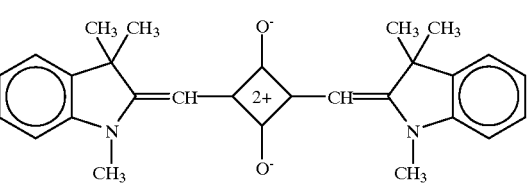

FORMULA 6

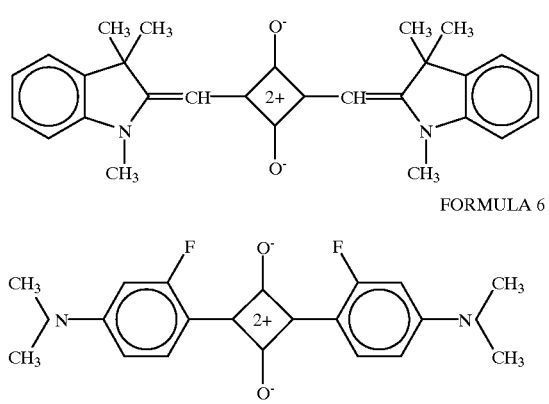

Examples of the N,N-dialkylaniline to be used in the invention may include N,N-dimethylaniline, N,N-diethylaniline, N,N,2,4,6-pentamethylaniline, 2,6-diethyl-N,N-dimethylaniline, 2,6-diisopropyl-N,N-dimethylaniline, p-t-butyl-N,N-dimethylaniline, 4,4-methylenebis-N,N-dimethylaniline, 4-bromo-N,N-dimethylaniline, 4-chloro-N,N-dimethylaniline, 3-chloro-N,N-dimethylaniline, 4-fluoro-N,N-dimethylaniline, N,N-dimethyl-p-toluidine, N,N-dimethyl-p-phenylenediamine, N,N-dimethyl-m-phenylenediamine, N,N-dimethyl-1-naphthylamine, N,N-dimethylbenzylamine, N,N-dimethylthioanisidine, p-dimethylaminobenzaldehyde, and 4-dimethylaminoazobenzene.

While N,N-dialkylaniline is well known as a sensitizer, it is very effective for a photocurable composition containing a metal arene compound and a squarylium dye. In the case of other known sensitizers, a reduction in sensitivity is brought about. In particular, 3,3',4,4'-tetra-(t-butylperoxicarbonyl)benzophenone; as the sensitizer brings about polymerization at the time it is mixed. The usefulness of N,N-dialkylaniline has been discovered as the result of testing of various sensitizers.

If necessary, the photocurable composition may further comprise thermal polymerization inhibitors, sensitizers, surface active agents, solvents, and dyes and pigments with the proviso that they do not inhibit or negatively affect the photosensitive characteristics of the photocurable composition.

The mechanism of the curing reaction of the photocurable composition according to the invention is not fully understood, but is believed to operate as follows:

The squarylium dye absorbs light and is excited. When the excited squarylium dye is returned to the ground state, the metal arene compound is activated by the movement of electrons or energy released. The activated metal arene compound contributes to generation of radicals from the radical polymerizable unsaturated group-bearing compound.

The resultant radicals cause the radical polymerizable unsaturated group-bearing compound to be polymerized. At this time, the N,N-dialkylaniline is considered to suppress a polymerization termination reaction by oxygen.

The invention will be more clearly understood with reference to the following example.

EXAMPLE

The following ingredients were mixed and ultrasonically dispersed.

10 g of polyethylene glycol diacrylate:pentaerythritol hexaacrylate (7:12)

1.5 g of metal arene compound having the following formula:

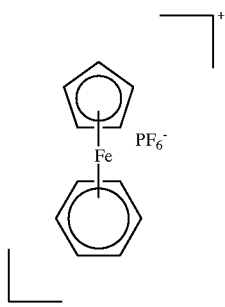

FIG. 7

0.5 g of squarylium dye having the following formula:

FORMULA 8

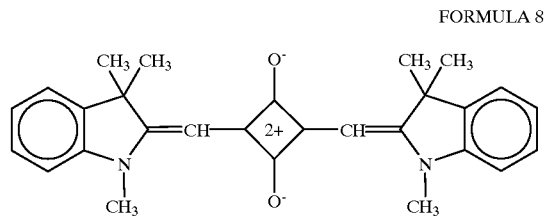

0.2 g of a N,N-dialkylaniline as shown in Table 1.

The resultant dispersion was heated at 100 C. and kneaded to obtain a photocurable composition. The composition was applied onto a 50 μm thick polyester film by the use of a bar coater and the applied side was covered with a similar polyester film to prepare a sample. The sample was exposed to light and cured. A spectral sensitometer was used to determine the energy for curing the composition by measuring the curing height at the maximum wavelength for curing given the irradiation energy from a light source at the wavelength and the exposure time.

The curing energies for photocurable compositions employing other sensitizers, instead of the N,N-dialkylaniline, and for photocurable compositions employing no sensitizers were similarly determined as comparative examples.

The results of the determinations are shown in Table 1 below.

| | Sensitizer | Curing energy (erg/cm$^2$) |
|---|---|---|
| Example 1 | N,N-dimethylaniline | 3684.8 |
| Example 2 | N,N-diethylaniline | 3714.41 |
| Example 3 | 2,6-diisopropyl-N,N-dimethylaniline | 1340.45 |
| Example 4 | N,N-dimethylbenzylamine | 4008.39 |
| Example 5 | N,N-dimethyl-p-toluidine | 3542.94 |
| Example 6 | p-dimethylaminobenzaldehyde | 3095.15 |
| Comparative example 1 | 3,3',4,4'-tetra-(t-butylperoxy-carbonyl)benzophenone | Cured when mixed |
| Comparative example 2 | mercaptobenzoxazole | 6202.48 |
| Comparative example 3 | benzil | 5756.37 |
| Comparative example 4 | not added | 4070.4 |

In the Example mentioned above, 15 parts by weight of the metal arene compound, 5 parts by weight of the squarylium dye and 2 parts by weight of the N,N-dialkylaniline were used for 100 parts by weight of the radical polymerizable unsaturated group-bearing compound. However, substantially the same result as that obtained by the Example may be obtained by using 1–40 parts by weight of the metal arene compound, 0.05–20 parts by weight of the squarylium dye and 0.1–20 parts by weight of the N,N-dialkylaniline for 100 parts by weight of the radical polymerizable unsaturated group-bearing compound.

The photocurable composition in Comparative example 4 employs a metal arene compound and a squarylium dye as a photopolymerization initiator system as disclosed in Japanese Patent Application No. Hei 3-168404 mentioned previously. It is appreciated from Table 1 that this composition in Comparative example 4 is cured with considerably lower energy as compared with the compositions in Comparative examples 2 and 3. However, it is also appreciated from Table 1 that the compositions in Examples 1 to 6, according to the invention, are cured with much lower energies as compared with the composition in Comparative example 4.

Thus, as apparent from the above description and Table 1, the photocurable composition of the invention is cured with low energy by visible light having long wavelengths or near infrared light owing to wavelength sensitization caused by the metal arene compound, the squarylium dye and the N,N-dialkylaniline. Accordingly, a low-power light source such as a He-Ne laser can be used to cure the photocurable composition of the invention or the photocuring operation time can be reduced.

What is claimed is:

1. A photocurable composition highly sensitive to near infrared radiation and visible light having a wavelength of greater than 550 nm, comprising:

100 parts by weight of a radical polymerizable unsaturated group-bearing compound;

1–40 parts by weight of a metal arene compound;

0.05–20 parts by weight of a squarylium dye; and 0.1–20 parts by weight of N,N-dialkylaniline sensitizer selected from the group consisting of N,N-dimethylaniline, N,N-diethylaniline, N,N,2,4,6-pentamethylaniline, 2,6-diethyl-N,N-dimethylaniline, 2,6-diisopropyl-N,N-dimethylaniline, p-t-butyl-N,N-dimethylaniline, 4,4-methylenebis-N,N- dimethylaniline, 4-bromo-N,N-dimethylaniline, 4-chloro-N,N-dimethylaniline, 3-chloro-N,N-dimethylaniline, 4-fluoro-N,N-dimethylaniline, N,N-dimethyl-p-toluidine, N,N-dimethyl-p-phenylenediamine, N,N-dimethyl-m-phenylenediamine, and 4-dimethylaminoazobenzene.

2. The photocurable composition according to claim 1, wherein said radical polymerizable unsaturated group-bearing compound is at least one compound selected from a group consisting of N-vinyl-2-pyrrolidone, bisphenol A diacrylate, bisphenol A dimethacrylate, tripropylene glycol diacrylate, tripropylene glycol dimethacrylate, pentaerythritol triacrylate, pentaerythritol trimethacrylate, dipentaerythritol hexaacrylate, dipentaerythritol hexamethacrylate, trimethylolpropane triacrylate, and trimethylolpropane trimethacrylate.

3. The photocurable composition according to claim 1, wherein said squarylium dye has the following general formula:

FORMULA 2

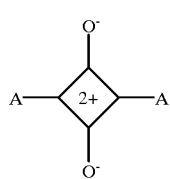

wherein each A represents a substituted or unsubstituted condensed ring group, a methylene group double bonded to a substituted or unsubstituted heterocyclic ring, or a substituted or unsubstituted aminophenol group.

4. The photocurable composition according to claim 1, wherein said metal arene compound has the following general formula:

FORMULA 1

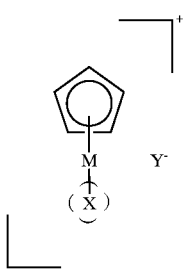

wherein X represents a group containing at least one benzene ring; Y represents a basic ion selected from the group consisting of $BF_4^-$, $PF_6^-$, $AsF_6^-$ and $SbF_6^-$; and M represents a metal selected from the group consisting of iron, nickel and cobalt.

5. A photocurable composition highly sensitive to near infrared radiation and visible light having a wavelength of greater than 550 nm, comprising:

100 parts by weight of a radical polymerizable unsaturated group-bearing compound;

1–40 parts by weight of a metal arene compound having a formula:

wherein X represents a group containing at least one benzene ring; Y represents a basic ion selected from the group consisting of $BF_4^-$, $PF_6^-$, $AsF_6^-$, and $SbF_6^-$; and M represents a metal selected from the group consisting of iron, nickel and cobalt;

0.05–20 parts by weight of a squarylium dye having a formula:

wherein each A represents a substituted or unsubstituted condensed ring group, a methylene group double bonded to a substituted or unsubstituted heterocyclic ring, or a substituted or unsubstituted aminophenol group; and 0.1–20 parts by weight of N,N-dialkylaniline sensitizer selected from the group consisting of N,N-dimethylaniline, N,N-diethylaniline, N,N,2,4,6-pentamethylaniline, 2,6-diethyl-N,N-dimethylaniline, 2,6-diisopropyl-N,N-dimethylaniline, p-t-butyl-N,N-dimethylaniline, 4,4-methylenebis-N,N-dimethylaniline, 4-bromo-N,N-dimethylaniline, 4-chloro-N,N-dimethylaniline, 3-chloro-N,N-dimethylaniline, 4-fluoro-N,N-dimethylaniline, N,N-dimethyl-p-toluidine, N,N-dimethyl-p-phenylenediamine, N,N-dimethyl-m-phenylenediamine, and 4-dimethylaminoazobenzene.

6. The photocurable composition according to claim 5, wherein said N,N-dialkylaniline is N,N,2,4,6-pentamethylaniline.

7. The photocurable composition according to claim 5, wherein said metal arene is:

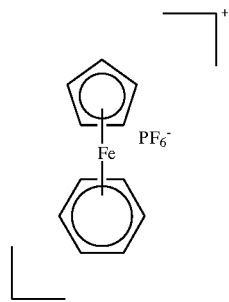

8. A photocurable composition highly sensitive to near infrared radiation and visible light having a wavelength of greater than 550 nm, comprising:

100 parts by weight of a radical polymerizable unsaturated group-bearing compound;

1–40 parts by weight of a metal arene of:

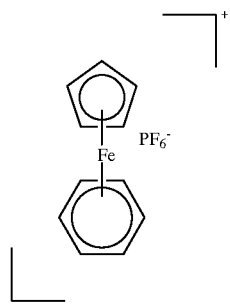

0.05–20 parts by weight of a squarylium dye having a formula:

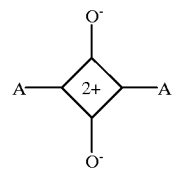

wherein each A represents a substituted or unsubstituted condensed ring group, a methylene group double bonded to a substituted or unsubstituted heterocyclic ring, or a substituted or unsubstituted aminophenol group; and 0.1–20 parts by weight of N,N,2,4,6-pentamethylaniline.

* * * * *